United States Patent [19]

Trodden

[11] Patent Number: 5,487,045
[45] Date of Patent: Jan. 23, 1996

[54] SENSE AMPLIFIER HAVING VARIABLE SENSING LOAD FOR NON-VOLATILE MEMORY

[75] Inventor: Thomas J. Trodden, Albuquerque, N.M.

[73] Assignee: Philips Electroics North America Corporation, New York, N.Y.

[21] Appl. No.: 308,047

[22] Filed: Sep. 16, 1994

[51] Int. Cl.[6] .................................................. G11C 29/00
[52] U.S. Cl. ........................ 365/205; 365/207; 365/208; 365/210; 365/189.09
[58] Field of Search ..................................... 364/205, 207, 364/208, 185, 104, 210, 189.09

[56] References Cited

U.S. PATENT DOCUMENTS 5,132,576  7/1992  Park ........................................ 307/530
5,142,495  8/1992  Canepa .................................... 365/185
5,142,496  8/1992  Van Buskirk ............................ 365/208
5,297,101  3/1994  Tada et al. ............................... 365/185

Primary Examiner—David C. Nelms
Assistant Examiner—Vu A. Le
Attorney, Agent, or Firm—David L. Schreiber

[57] ABSTRACT

A sensing circuit for a non-volatile memory operating from a supply voltage and comprising non-volatile memory cells and a non-volatile reference cell maintained in an un-programmed condition, the sensing circuit comprising means for determining the sensed current of a memory cell when accessed and comparing it with the reference current to determine whether the accessed memory cell is pro-grammed or un-programmed. To allow opertion over a wide range of supply voltages, the sensing circuit comprises a scalable current mirror circuit connected to the reference and memory cells and providing a ratio, M, of reference current to sensed current that, in response to changes in the supply voltage, varies.

11 Claims, 6 Drawing Sheets

1

SENSE AMPLIFIER HAVING VARIABLE SENSING LOAD FOR NON-VOLATILE MEMORY

FIELD OF INVENTION

This invention relates to semiconductor memories, and in particular to sense amplifier circuits for sensing the state stored in a cell of a non-volatile memory.

BACKGROUND OF INVENTION

An important design consideration for semiconductor memory systems is the support circuitry used to supply sensing of the memory state stored in each of the cells of the memory. Especially important nowadays are non-volatile-memory (NVM) chips, used to store program code, typically of the UV erasable (EPROM), or electrically-erasable (EEPROM), or FLASH type. In a typical conventional EPROM, the cells are connected in rows between horizontal word lines and in columns between vertical bit lines. One current sense amplifier is connected to each bit line adjacent each column of cells. By changing the voltage in a word line, all the cells in the associated row produce in the associated bit line a current, depending on their charge state, which current can be sensed by the sense amplifier connected to that bit line producing at the output of the amplifier a voltage representative of the programmed state (typically a binary "0"), or the un-programmed state (typically a binary "1") stored in the cell at the intersection of the word and bit lines.

As cells have shrunk in size in order to increase the memory size per chip, the sense currents have also reduced. To increase sensitivity, it is common to sense simultaneously a reference cell which is always in the un-programmed or ON or "1" condition, and at times to use a differential amplifier to which is input both the reference current from the reference cell and the sense current from the memory cell whose state is to be determined (herein referred to as the "sensed cell"). If the sensed cell is in the opposite programmed (OFF) condition, then the differential amplifier outputs one value. When the sensed cell is in the same un-programmed (ON) condition, the differential amplifier outputs the opposite value.

SUMMARY OF THE INVENTION

An object of the invention is an improved sense amplifier circuit for IC memories.

A further object of the invention is a NVM capable of operation over a larger range of supply voltages.

Another object of the invention is a sensing circuit capable of changing sensitivity in respose to changes in the supply voltage.

In accordance with a first aspect of the invention, a NVM memory operable over a larger supply voltage range comprises a load ratio sensing scheme and in particular a scalable load ratio sensing scheme. In the typical EPROM memory employing such a sense amplifier, un-programmed cells are ON cells, and programmed cells are OFF cells. Each NVM cell has a natural turn-on threshold, Vt, when the state of the cell can be switched from its OFF to its ON state. The invention recognizes that a specific relationship exists between programmed and un-programmed cells, the supply voltage available, and the current sensitivity of the sense amplifier required to sense properly a programmed or un-programmed memory cell. The sense amplifier circuit of the invention provides the automatic capability of controlling the sensitivity of the sense amplifier in accordance with the available supply voltage.

In a preferred embodiment of the invention, the reference cell sensing circuit has a size X and the memory cell sensing circuit has a size that is a fraction (less than 1) of X in series with an analog control transistor. Preferably, the reference cell sensing circuit comprises A parallel-connected transistors corresponding in size to the size X, where $A \geq 3$, and the memory cell sensing circuit comprises B parallel-connected transistors corresponding in size to the fraction of X, where $B \geq 1$, with the analog control transistor in series with the B transistors. Means are provided connected to the supply voltage and providing to the control electrode a signal that varies in accordance with the supply voltage to control the degree to which the control transistor is ON and thereby provides an effective number, S, of B parallel transistors in the sensing circuit that can vary continuously from 1-B. This allows the ratio of A:S to vary between A:1 and A:B and thus the sensitivity of the sensing circuit as the supply voltage varies from, say, 1–8 V.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention.

BRIEF DESCRIPTION OF DRAWINGS

In the drawings, where like reference numerals or letters refer to like components.

DETAILED DESCRIPTION OF PREFERRED EMBODIMENTS

Figure 1:
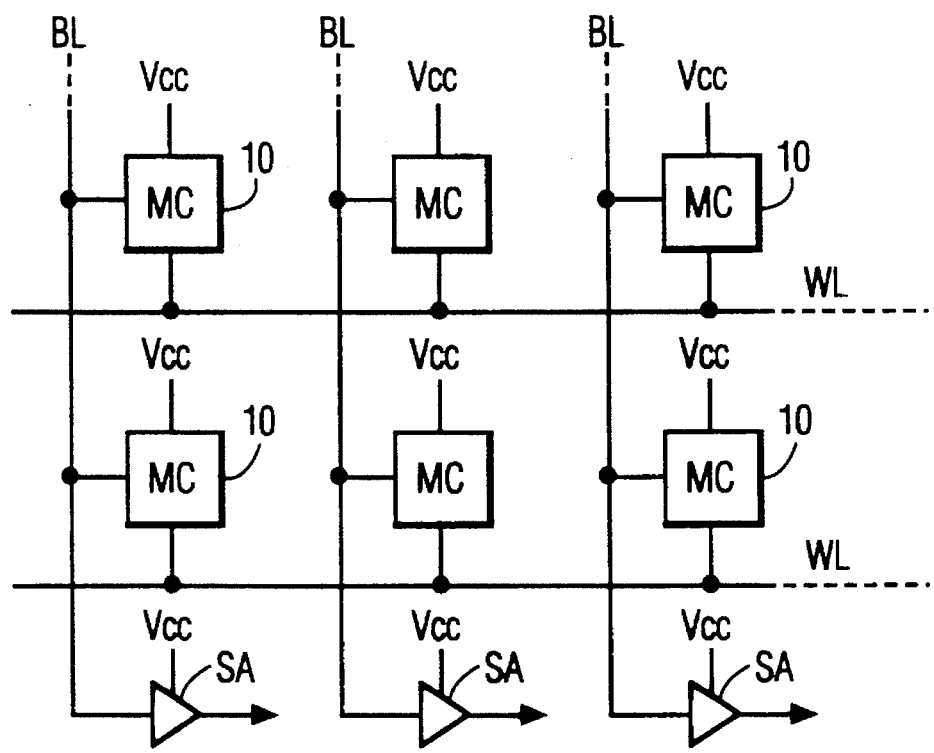
FIG. 1 is a block of a typical semiconductor memory.
Figure 2:
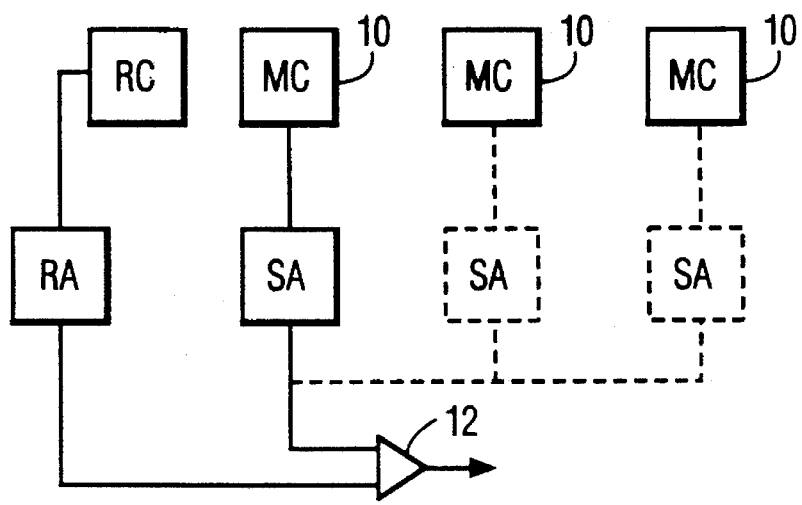
FIG. 2 shows typical connections of the semiconductor memory to a differential amplifier.

FIG. 1 shows a typical IC memory comprising 2 rows of memory cells 10 arranged in 3 columns, recognizing that most memories of 1K or higher will have many more rows and many more columns. Each memory cell is connected, horizontally, to a word line WL, and vertically, to a bit line BL. Each bit line is connected to a sense amplifier SA. Vcc represents the supply voltage. When a word line is asserted, the connected memory cell supplies a current in the connected bit line to the sense amplifier SA. To improve sensitivity, as shown in FIG. 2, the output of the sense amplifier SA is connected as one input of a differential amplifier 12. The second input is connected to a reference amplifier RA which in turn is connected to a reference cell RC which is un-programmed (ON) and establishes a fixed reference current Iref each time a word line is asserted. The fixed reference current (memory cell RC ON) establishes a reference voltage on one input of the differential amplifier. This voltage becomes the amplifier trip point. The sensed current of memory cell 10 is translated into a voltage on the other input of the differential amplifier that swings above or below the amplifier trip point depending on the stored memory state (programmed or unprogrammed) of the cell, thereby switching the differential amplifier between its "0" and "1" outputs representative of the memory cell stored state.

Figure 3:
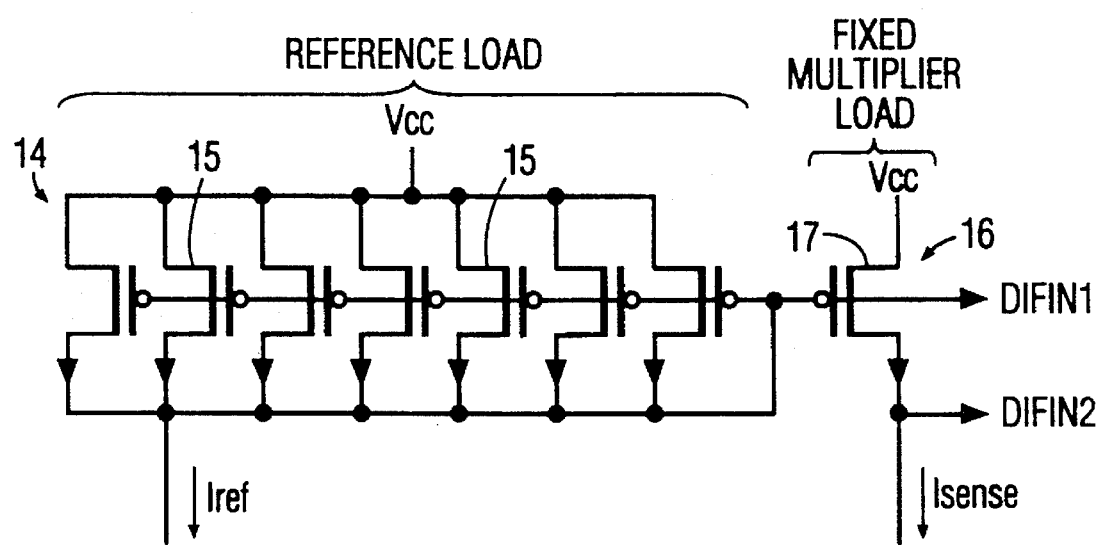
FIG. 3 is a schematic circuit diagram of a traditional non-volatile sense amplifier utilizing a fixed load ratio sensing scheme.

FIG. 3 illustrates a traditional sense amplifier of the load current type with a fixed sensitivity, i.e., a fixed current ratio between the reference NVM cell and the sensed NVM cell. The load 14 for the reference current Iref is supplied by seven p-MOS transistors (denoted by an open circle at the gate) 15 each having a 10:4 width to length ratio. Each reference transistor (not shown in FIG. 3) is un-programmed which in this instance means it is always ON sinking Iref.

The load 16 for the memory cell, in contrast, is formed by a single p-MOS transistor 17 of the same width:length ratio. In this fixed load ratio approach using a fixed load current mirror scheme, the reference portion of the mirror thus consists of 7 p-MOS transistor loads and the multiplier portion consists of one p-MOS load in this example. This results ideally in a fixed sense current, that is, 1:7 or 1/7 of the reference current under all supply voltages. In general, the smaller the ratio, the greater the current sensitivity.

The problem with the fixed load ratio approach is its fixed sensitivity over the entire supply range. As the supply voltage approaches the natural Vt of the non-volatile sensed cell (lower supply voltage range) increased current sensitivity of the sense amplifier is required to sense an un-programmed cell (ON cell). Sensing programmed cells (OFF cells) while operating at the lower voltage range is not a problem since present non-volatile memory cell technologies are capable of producing cells with Vt shift (programming mechanism) far in excess of the lower operating supply voltage. As a result, the programmed device remains OFF even at the lower supply voltages. As the supply voltage increases (higher supply voltage range), the supply voltage approaches the programmed Vt of the non-volatile memory cell. In this situation, decreased current sensitivity of the sense amplifier is required to sense a programmed cell. Sensing un-programmed cells while operating at the higher supply voltage range is not a problem since the supply voltage is far in excess of that required to turn an un-programmed cell on. This relationship between programmed and un-programmed cells and the supply voltage is what the extended voltage range non-volatile memory sense amplifier of the invention uses to solve the problem.

The extended voltage range non-volatile memory sense amplifier of the invention employs a scalable ratio load current sensing scheme. The scalability of the ratio load is a function of the power supply voltage.

Figure 4:
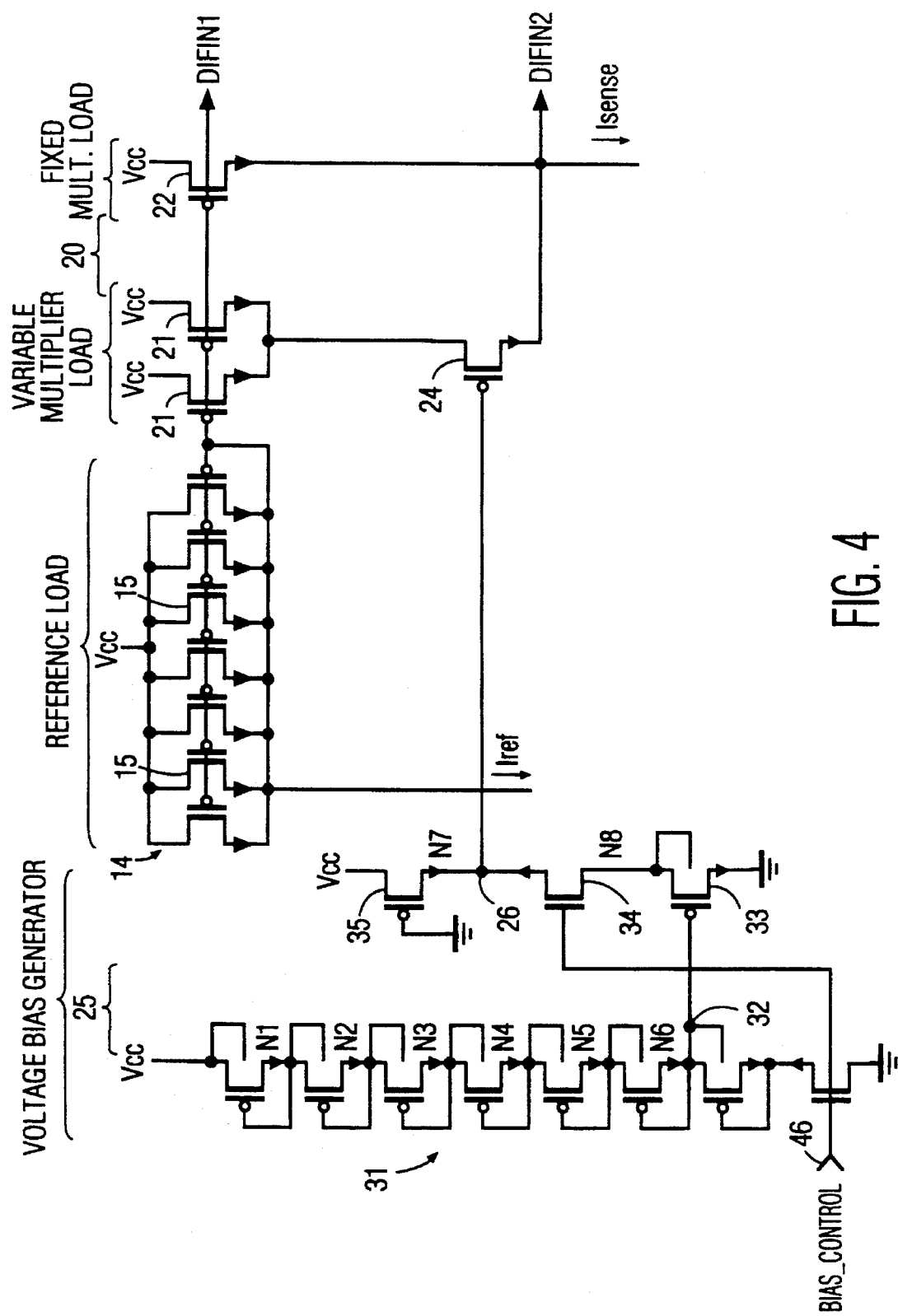
FIG. 4 is a schematic circuit diagram of one form of non-volatile sense amplifier employing a scalable load ratio sensing scheme in accordance with the invention.

FIG. 4 shows one form of the circuit of the invention. In this example, the number of reference load transistors 15 remains the same at seven, but now the multiplier load 20 comprises two controllable or variable load transistors 21 and one fixed load transistor 22 in the multiplier portion of the mirror. The two variable transistors 21 are controlled by a p-MOS transistor 24 that is in series. The transistor 24 in turn is controlled by a bias generator circuit 25 that produces a bias voltage at node 26 that decreases as a percentage of the supply voltage as the supply voltage increases. In the example of FIG. 4, under Low voltage supply operation, the high bias cuts OFF transistor 24 thus isolating both transistors 21 and, as a result, the multiplier portion of the mirror is only one p-MOS transistor 22 in size. This results in a current ratio of 1:7, the same as in the fixed ratio load current mirror (FIG. 3). However, under high voltage supply operation, the bias reduces and both transistors 21 are fully ON resulting in a multiplier portion that contains three p-MOS transistors 21, 21, 22. The current ratio is then 3:7 under the higher supply voltage operating condition thus reducing the current sensitivity of the sense amplifier.

Operation of the system will become clearer with the following explanation, reference being had to "CMOS Analog Circuit Design" by P. E. Allen, published by Holt, Rinehart & Winston Inc. of Orlando, Fla., 1987, which contains a detailed description of a load ratio sensing scheme.

Figure 6:
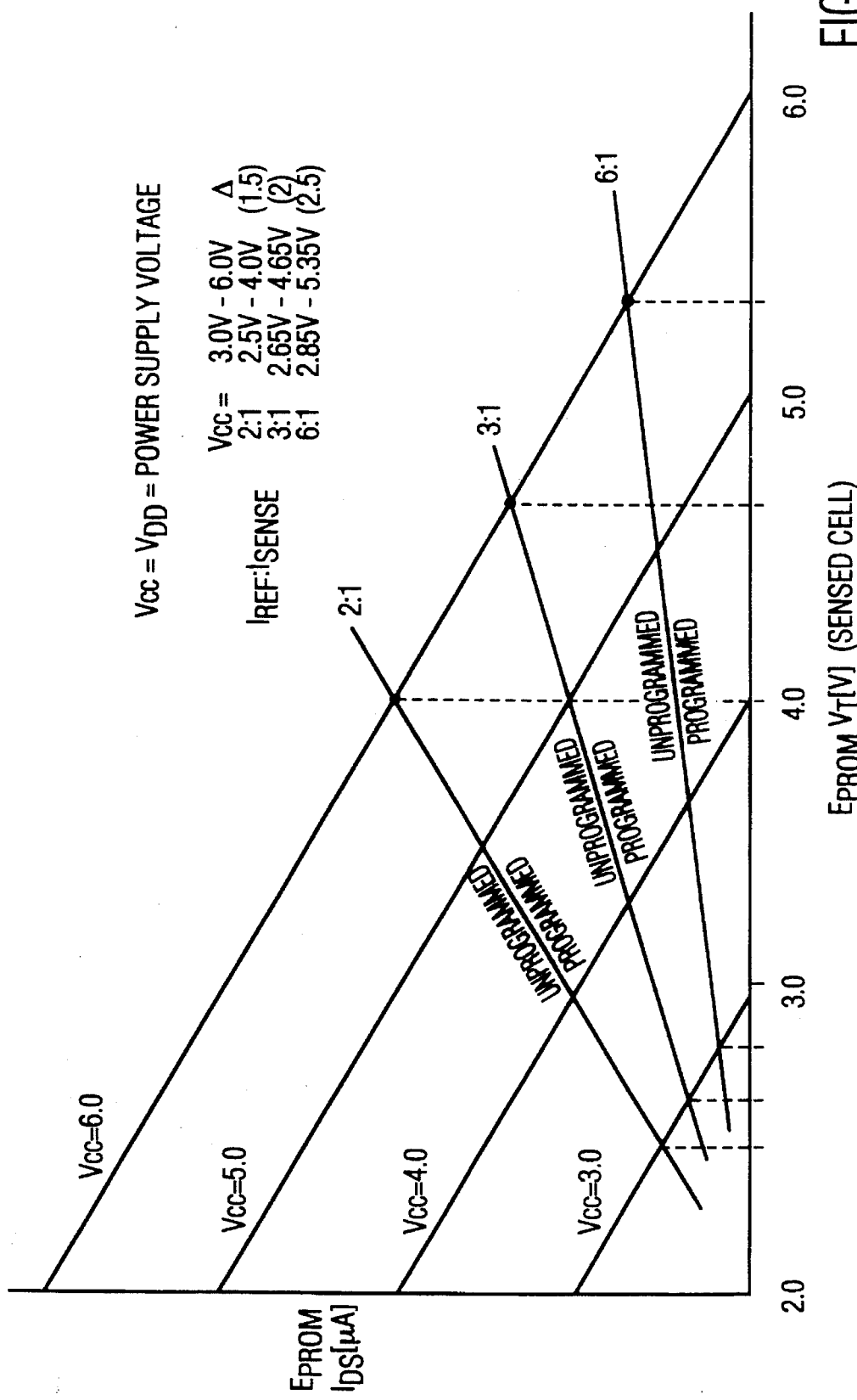
FIGS. 6 and 7 are graphs illustrating operation of the circuit of the invention in contrast with that of the prior art.

In accordance with general sense amplifier principles, to a first order, the sense amplifier trip point (DC) can be described as follows:

$$Vt\_trip = (M-1/M)(Vcc) + Vt\_ref/M \quad (1)$$

where Vt_trip represents the threshold voltage of the sensed cell, VCC is the power supply voltage. Vt_ref represents the reference cell threshold voltage, and M represents the ratio of reference cell current to sense cell current (the A:B ratio previously described). FIG. 6 is a graphical representation of Equation 1 using:

Vt_ref=2.0 V,

M=2, 3, and 6, and

Vcc=3.0 V, 4.0 V, and 6.0 V, for a typical EPROM of the floating gate type with its $I_{DS}$ characteristic plotted as current along the ordinate as a function of the EPROM's Vt along the abscissa with Vcc as the parameter.

For M=2, the Vt_trip (represented by Vt for the sensed cell), ranges from 2.5 V at Vcc=3.0 V to 4.0 V at Vcc=6.0 V for a delta (4.0–2.5) of 1.5 V. For M=6, the Vt_trip ranges from 2.83 V at Vcc=3.0 V to 5.33 V at Vcc=6.0 V for a delta of 2.5 V. The significance of the Vt_trip range can be described as follows; the Vt_trip at Vcc(min) (3.0 V in the above example) represents the maximum sense cell Vt of an un-programmed cell for a given power supply voltage range, and the Vt_trip at Vcc(max) (6.0 V in the above example) represents the minimum sense cell Vt of a programmed cell for a given power supply voltage range. The delta voltage between these two numbers represents the "un-usable" range of the sense cell Vt for the specified power supply voltage range. To further illustrate, for M=2, if during non-volatile cell programming, the resultant cell Vt=3.5 V, then at Vcc=3.0 V, the cell would be sensed as programmed. At Vcc=6.0 V, however, the cell would be sensed as un-programmed.

Two important DC effects should be noted from FIG. 6. First, as M increases from 2 to 6, so does the range of "un-usable" sense cell Vt. This is not a desirable effect since it reduces the usable Vt range of programmed cells (Vt_trip at VCC(max) to the maximum programmed cell Vt). Second, as M increases from 2 to 6, so does the delta between the Vt_ref (Vt_ref=2.0 V in the above example) and the Vt_trip at Vcc(min). This a desirable effect since it extends the range of un-programmed cell Vt.

Another important aspect of sense amplifier design is speed of operation. This is controlled by adjusting the ratio of the ratio load current mirror. In general terms, as M increases, the speed of discharge (sensing an un-programmed cell) of the amplifier input increases. This relationship is given in the following expression:

$$dt = (M/M-1)(C/I)dv \qquad (2)$$

where dv is the change in voltage on the amplifier input required for sensing, C is the internal capacitance on the amplifier input, I is the reference current and M is the current mirror ratio. Conversely, as M increases, the speed of charging of the amplifier input decreases. This relationship is given in the following expression:

$$dt = (M)(C/I)|dv| \qquad (3)$$

where dv is the change in voltage on the amplifier input required for sensing, C is the internal capacitance on the amplifier input, I is the reference current and M is the current mirror ratio. Therefore, Equations 2 and 3 place the lower and upper constraints on M, respectively.

Figure 8:
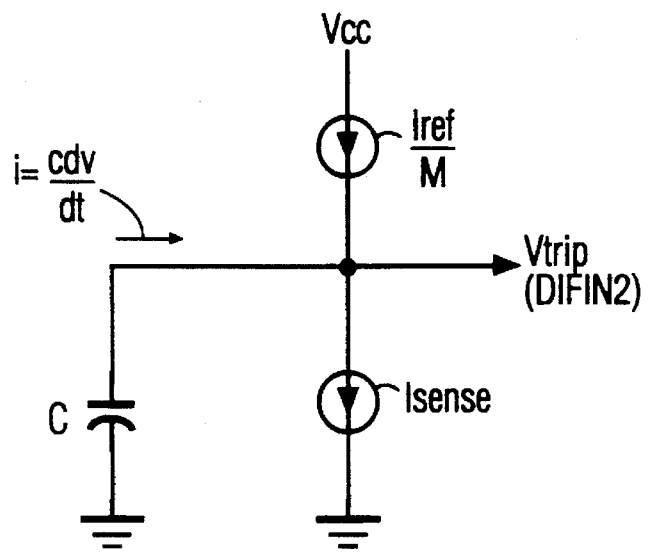
FIG. 8 is a simple schematic used to help explain the invention.

Those equations (2) and (3) are derived from FIG. 8, which is a simplified view of a ratio load current mirror which converts current to voltage to drive an amplifier.

Figure 7:
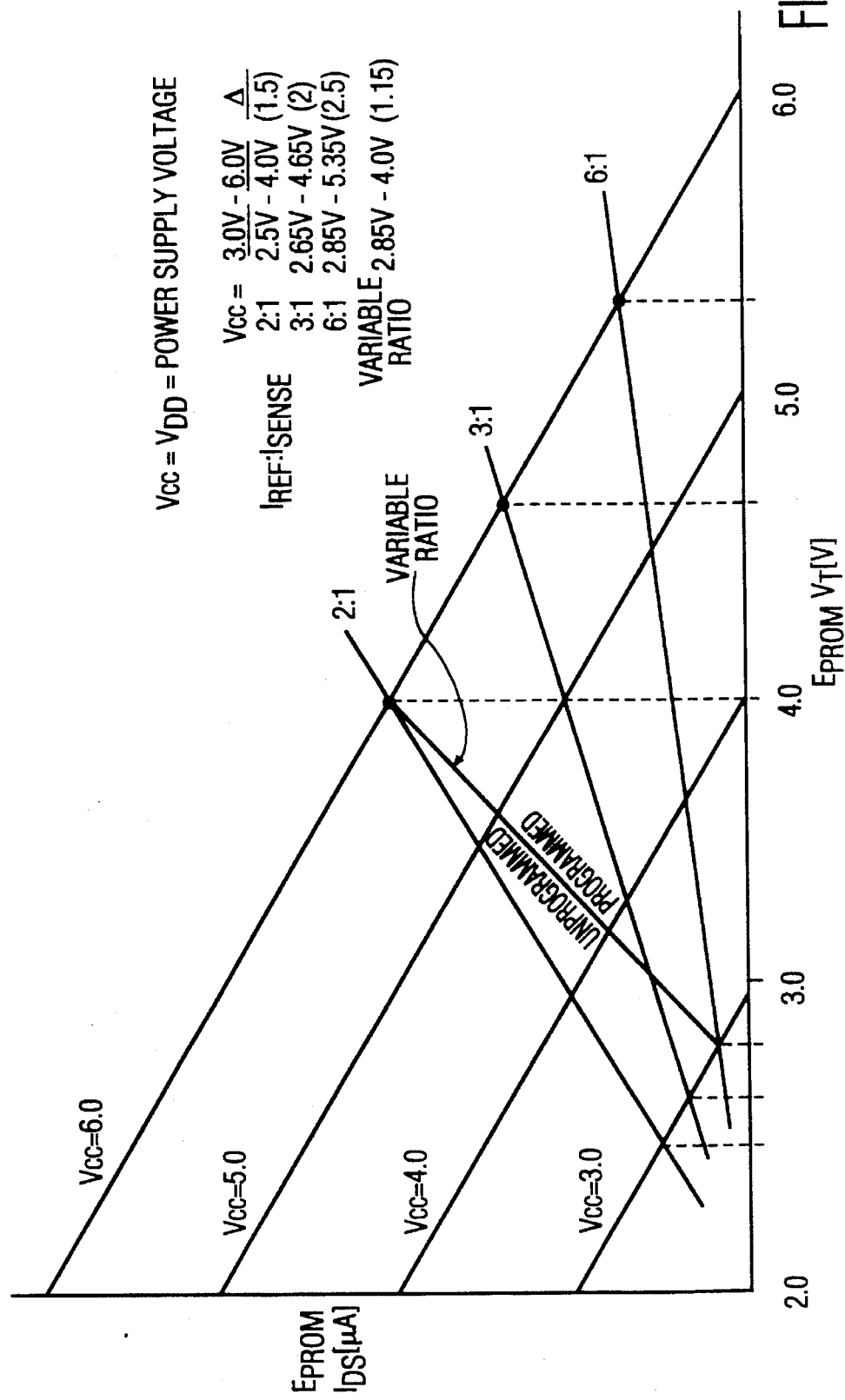

The scalable ratio load current sensing scheme of the invention allows for the adjustment of M as a function of the power supply voltage. This scalability allows for design optimization over a wider power supply voltage range. FIG. 7 illustrates the design improvement. Shown in FIG. 7 for convenience are the three fixed ratios M=2, M=3, and M=6 previously shown an FIG. 6. In addition, the scalable or variable ratio is shown at 30. For the variable ratio, at a power supply voltage of 3.0 V, M=6; at a power supply voltage of 6.0 V, M=2.

Two important improvements have occurred. First, at low power supply operating voltages (3.0 V in the above example), the speed of the sense amplifier is optimized since memory cells have reduced current drive. Therefore, the optimum value for M is determined using the constraints of Equations 2 and 3 for low current operation. In addition, the DC trip-point has increased providing additional margin between the reference cell and the maximum sense cell Vt of an un-programmed cell.

Second, at high power supply operating voltages (6.0 V in the above example), the DC trip-point is optimized. With M=2, the minimum sense cell Vt of a programmed cell has been reduced. Comparing the "un-usable" range (delta) of sense cell Vt of the fixed ratios with the scalable ratio (1.5 V for M=2, 2.5 V for M=6 and 1.15 V for M=scalable), the scalable ratio produces a smaller "un-usable" range. At high power supply operating voltages, memory cells have increased current drive, thus reducing the need to optimize sense amplifier speed using M.

In the FIG. 4 embodiment, two outputs, DIFIN1 and DIFIN2, are shown. When the output amplifier is a differential amplifier, then DIFIN1 and DIFIN2 represent the two inputs to the amplifier. However, a differential amplifier is not essential. A single-ended amplifier can be used, in which case DIFIN2 alone is used as the output and input to the single-ended amplifier.

The voltage bias generator 25 comprises a voltage divider 31 made up of p-MOS transistors connected as current mirrors, from a node 32 of which is derived a voltage controlling a p-MOS transistor 33 connected in series with p-MOS transistors 34 and 35 from whose node 26 is derived a bias voltage for the gate of transistor 24. As Vcc changes, so does the bias voltage in an inverted manner controlling continuously the variable multiplier load represented by the two transistors 21. Thus, increases in Vcc result in decreases in the bias voltage at node 26. The transistor 24 in this case acts as a variable resistor.

Figure 5:
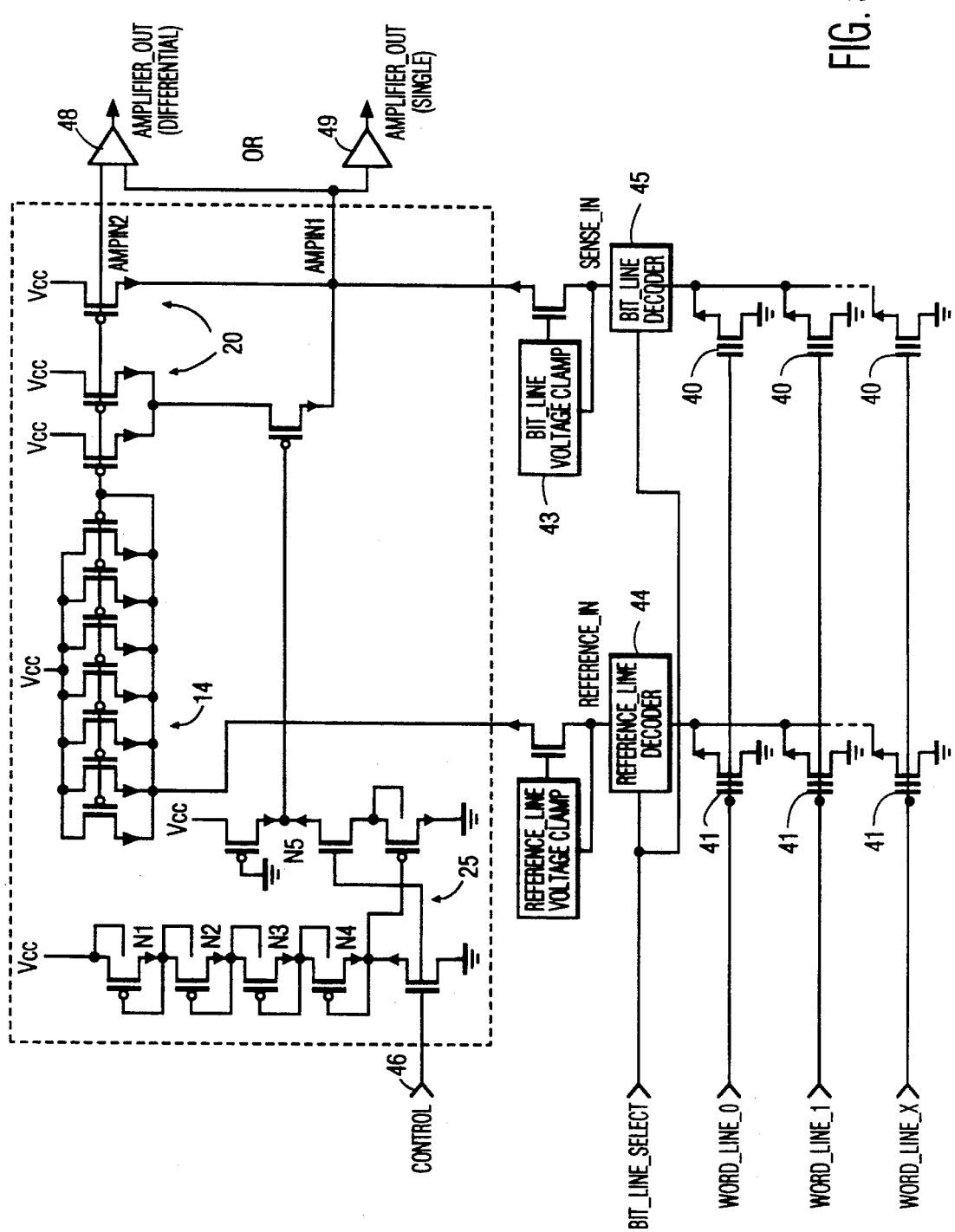
FIG. 5 is a schematic circuit diagram of the sense amplifier of FIG. 4 shown connected to a memory circuit shown only schematically.

FIG. 5 shows the sense amplifier circuit of FIG. 4 connected to the memory and several additional conventional circuits. Only several of the many memory cells are shown at 40, and only several of the many reference cells 41. Each word line when asserted activates a reference cell 41 and a row of memory cells 40. The blocks referenced 42–45 are described by their labels and are conventional in EPROM memories. The CONTROL input at 46 corresponds to the BIAS CONTROL input in FIG. 4 and functions to turn off the system in a power-down mode of the IC. FIG. 5 also shows two outputs AMPIN2, corresponding to DIFIN1, and AMPIN1, corresponding to DIFIN2. When a differential amplifier 48 is used, AMPIN2 and AMPIN1 are connected as shown. When a single-end amplifier 49 is used, then only the AMPIN1 output is connected as shown.

The key concept of the invention is that of current mirror scalability. In general terms, the scalable current mirror is composed of four components: a reference load, a fixed multiplier load, a variable multiplier load, and a voltage bias generator that controls the variable multiplier load by generating a bias voltage that decreases as a percentage of supply voltage as the supply voltage increases. Reduced bias voltage means increased Isense and thus a reduced ratio M.

A general relationship between the three load elements can be developed. If X represents the size of reference load in terms of the number of transistors of a unit dimension, Y represents the size of the fixed multiplier load in terms of the number of transistors of a unit dimension, and Z represents the size of the variable multiplier load in terms of the number of transistors of a unit dimension, then Y and Z are constrained as follows:

$$(X-1) \geq (Y+Z) \geq 2 \qquad (4)$$

While it is preferred that Y is also ≧1, it is also possible for Y=0, provided that a minimum bias voltage is provided to ensure that the variable multiplier load provides a minimum Isense corresponding to a fixed multiplier load. In this situation, Z would be chosen equal to 3 to emulate the performance of the FIG. 4 circuit. It will also be understood that the invention can be implemented by use of a single MOS transistor with, say, a width (W1) for the reference load and a single MOS transistor with, say, a width (W2) for the multiplier load where the two widths determine the size of the respective transistors and are chosen in accordance with the principles taught herein.

While the sizes of components have been given in the example, this is not critical, and other component sizes can be used. Also, the voltage supply operating ranges given, while preferred, are not critical. Similarly, the p-MOS transistors can be replaced by n-MOS transistors or by bipolar transistors with appropriate changes in supply voltage polarities. Other kinds of bias generators that will supply an output voltage as a function of supply voltage can be substituted. Also, as will be evident from equation (4), the number of reference load transistors are net limited to 7, nor the multiplier load to 3. For clarity's sake, in the schematics, the arrows at the MOS transistors denote the transistor drain electrode.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A sensing device for a memory operating with a supply voltage and comprising a plurality of memory cells each of whose ON and OFF states represents stored memory information and a reference cell which is maintained continuously in one of the ON and OFF states, said sensing circuit comprising:

(a) a reference circuit connected to the reference cell and representing a reference load capable of carrying a first reference load current, (b) a sensing circuit connected to at least one of the memory cells and representing a sensing load for the memory cell, said sensing load being capable of carrying a second sensing load current, the ratio of said first reference load current to said second sensing load current being non-zero, (c) means responsive to a value of the supply voltage for changing the ratio of said first reference load current to said second sensing load current.

2. A sensing device for a memory operating with a supply voltage and comprising a plurality of memory cells each of whose ON and OFF states represents stored memory information and a reference cell which is maintained continuously in one of the ON and OFF states, said sensing circuit comprising:

(a) a reference circuit connected to the reference cell and representing a reference load for the reference cell, said reference load corresponding to a first plurality of parallel-connected transistors and capable of carrying a first reference load current, (b) a sensing circuit connected to at least one of the memory cells and representing a sensing load for the memory cell, said sensing load corresponding to a second plurality of parallel-connected transistors and capable of carrying a second sensing load current, the ratio of said first reference load current to said second sensing load current representing the sensitivity of said sensing circuit, (c) means responsive to a value of the supply voltage for changing the ratio of said first reference load current to said second sensing load current and thereby changing the sensing circuit sensitivity in response to changes in the supply voltage.

3. The memory sensing device of claim 2, wherein the first plurality of transistors is greater than the second plurality of transistors.

4. The memory sensing device of claim 2, wherein the means of claim element (c) for changing the ratio comprises:

(i) first means for outputting a control voltage whose value depends on the supply voltage, (ii) second means comprising a voltage divider including a transistor connected to receive the control voltage and whose current depends upon the control voltage and establishing in response to the control voltage a first bias voltage, (iii) third means connected to receive the first bias voltage and functioning as a variable resistance, said third means being connected in series in the sensing circuit.

5. A sensing circuit for a non-volatile memory operating from a supply voltage and comprising non-volatile memory cells and a non-volatile reference cell maintained in an un-programmed condition, said sensing circuit comprising means for determining the sensed current of a memory cell when accessed and comparing it with the reference current to determine whether the accessed memory cell is programmed or un-programmed, said sensing circuit comprising:

(a) a scalable current mirror circuit connected to the reference and memory cells and providing a first ratio, M, of reference current to sensed current, (b) means in response to changes in the supply voltage to vary the first ratio M.

6. The memory sensing circuit of claim 5, wherein the means of claim element (b) comprises means for reducing the first ratio M in response to increases in the supply voltage.

7. The memory sensing circuit of claim 5, wherein the scalable current mirror circuit comprises a reference load for the reference cell, a fixed and a variable multiplier load for the memory cell, the means of claim element (b) comprising a controllable element connected to the variable multiplier load and means for generating a bias voltage for controlling the controllable element to vary the variable multiplier load.

8. The memory sensing circuit of claim 7, wherein the reference load comprises X units, the fixed multiplier load comprises Y units, and the variable multiplier load comprises Z units, wherein units represents current supplying size, and $$(x-1) \geq (Y+Z) \geq 2.$$

9. The memory sensing circuit of claim 8, wherein X represents 7 parallel transistors, Y represents 1 transistor, and Z represents 2 transistors, all transistors having the same width:length ratio.

10. A non-volatile memory circuit comprising plural non-volatile memory cells, a non-volatile reference cell, a supply voltage source for said cells, means for accessing a memory cell and a reference cell to cause both to conduct current dependent upon its programmed or un-programmed state, and a sensing circuit connected to the memory cell and reference cell for sensing their relative currents for determining the state of the memory cell, said sensing circuit comprising means in response to changes in the supply voltage for changing the relative sensitivity of the reference cell current to that of the memory cell current.

11. A non-volatile memory circuit as claimed in claim 10, wherein said sensing circuit comprises:

(a) a scalable current mirror circuit connected to the reference and memory cells and providing a first ratio, M, of reference current to sensed current, (b) means in response to changes in the supply voltage to vary the first ratio M.

* * * * *